US012560964B2

(12) United States Patent (10) Patent No.: US 12,560,964 B2
Oyama (45) Date of Patent: *Feb. 24, 2026

(54) DETECTION DEVICE

(71) Applicant: Japan Display Inc., Tokyo (JP)

(72) Inventor: Atsunori Oyama, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/905,307

(22) Filed: Oct. 3, 2024

(65) Prior Publication Data

US 2025/0028357 A1 Jan. 23, 2025

Related U.S. Application Data

(63) Continuation of application No. PCT/JP2023/012431, filed on Mar. 28, 2023.

(30) Foreign Application Priority Data

Apr. 5, 2022 (JP) ................................. 2022-063132

(51) Int. Cl.
*G06F 1/16* (2006.01)
*H05K 1/14* (2006.01)
(52) U.S. Cl.
CPC ............ *G06F 1/163* (2013.01); *G06F 1/1635* (2013.01); *G06F 1/1658* (2013.01); *H05K 1/147* (2013.01); *H05K 2201/10121* (2013.01)
(58) Field of Classification Search
None
See application file for complete search history.

(56) References Cited

U.S. PATENT DOCUMENTS

| | | | | | |
|---|---|---|---|---|---|
| 5,766,131 | A | * | 6/1998 | Kondo | A61B 5/681 |
| | | | | | 600/502 |
| 8,380,272 | B2 | * | 2/2013 | Barrett | A61B 5/02427 |
| | | | | | 600/323 |
| 10,188,329 | B2 | * | 1/2019 | Isaacson | A61B 5/14552 |

(Continued)

FOREIGN PATENT DOCUMENTS

| | | |
|---|---|---|
| JP | 2007-325675 A | 12/2007 |
| JP | 2011-107129 A | 6/2011 |

(Continued)

OTHER PUBLICATIONS

Search Report issued in related International Patent Application No. PCT/JP2023/012431 mailed on Jun. 13, 2023 and English translation of same. 7 pages.

(Continued)

*Primary Examiner* — Fred Tzeng
(74) *Attorney, Agent, or Firm* — K&L Gates LLP

(57) ABSTRACT

According to an aspect, a detection device includes: an annular housing; a first flexible substrate provided along a shape of the annular housing; a battery provided on the first flexible substrate; a light source provided on the first flexible substrate; and an optical sensor including a second flexible substrate and a plurality of photodiodes provided in a detection area of the second flexible substrate. One end of the second flexible substrate of the optical sensor overlaps one end of the first flexible substrate, and the second flexible substrate is electrically coupled to the first flexible substrate.

11 Claims, 17 Drawing Sheets

(56) References Cited

U.S. PATENT DOCUMENTS

| | | | | |
|---|---|---|---|---|
| 10,265,019 B2 * | 4/2019 | Gertsch | ............... | A61B 5/0008 |
| 10,366,220 B2 | 7/2019 | Shapiro | | |
| 11,888,080 B2 * | 1/2024 | Kato | ................... | H10F 39/811 |
| 12,126,181 B2 | 10/2024 | Sanchez | | |
| 12,165,430 B2 * | 12/2024 | Kato | ................... | G06V 40/145 |
| 2002/0026108 A1 | 2/2002 | Colvin | | |
| 2006/0122520 A1 * | 6/2006 | Banet | ................... | A61B 5/6814 |
| | | | | 600/323 |
| 2008/0125664 A1 * | 5/2008 | Sakai | ................ | A61B 5/02444 |
| | | | | 600/500 |
| 2012/0016245 A1 * | 1/2012 | Niwa | ................... | A61B 5/6826 |
| | | | | 600/476 |
| 2015/0208967 A1 * | 7/2015 | Tateda | ................... | A61B 5/024 |
| | | | | 600/323 |
| 2015/0220109 A1 | 8/2015 | von Badinski et al. | | |
| 2016/0157372 A1 | 6/2016 | Hiroki | | |
| 2016/0278672 A1 | 9/2016 | Cho et al. | | |
| 2017/0031326 A1 * | 2/2017 | Omote | ............... | G04B 37/1486 |
| 2018/0360341 A1 | 12/2018 | Wang | | |
| 2019/0216340 A1 * | 7/2019 | Holz | ...................... | A61B 5/489 |
| 2019/0380646 A1 * | 12/2019 | Gertsch | .................. | A41D 1/002 |
| 2020/0323489 A1 * | 10/2020 | Kim | ....................... | H05K 1/111 |
| 2022/0190038 A1 * | 6/2022 | Tada | ................... | G06V 10/141 |
| 2022/0341777 A1 | 10/2022 | Harrison | | |
| 2022/0366720 A1 * | 11/2022 | Oyama | ................ | H10K 77/111 |
| 2024/0008205 A1 | 1/2024 | Doval | | |
| 2024/0241541 A1 | 7/2024 | Makinen | | |
| 2024/0385649 A1 | 11/2024 | Tiensuu | | |
| 2025/0028357 A1 | 1/2025 | Oyama | | |
| 2025/0028358 A1 | 1/2025 | Oyama | | |
| 2025/0028360 A1 * | 1/2025 | Oyama | ................ | A61B 5/1455 |
| 2025/0028370 A1 | 1/2025 | Koide | | |
| 2025/0180471 A1 | 6/2025 | Kato | | |

FOREIGN PATENT DOCUMENTS

| | | |
|---|---|---|
| JP | 2012-065900 A | 4/2012 |
| JP | 2016-110640 A | 6/2016 |
| JP | 2017-506376 A | 3/2017 |
| JP | 2019-118460 A | 7/2019 |
| JP | 2022-175012 A | 11/2022 |
| WO | 2014/024653 A1 | 2/2014 |

OTHER PUBLICATIONS

Search Report issued in related International Patent Application No. PCT/JP2023/012412 mailed on Jun. 13, 2023 and English translation of same. 6 pages.

* cited by examiner

DETECTION DEVICE

CROSS-REFERENCE TO RELATED APPLICATION

This application claims the benefit of priority from Japanese Patent Application No. 2022-063132 filed on Apr. 5, 2022 and International Patent Application No. PCT/JP2023/012431 filed on Mar. 28, 2023, the entire contents of which are incorporated herein by reference.

BACKGROUND

1. Technical Field

What is disclosed herein relates to a detection device.

2. Description of the Related Art

Devices that detect information on a living body from a human body are known. Japanese Patent Application Laid-open Publication No. 2012-065900 discloses a pulse wave sensor that can measure pulse waves without constraining actions of a subject person.

When a light source, a battery, and an optical sensor including a plurality of photodiodes are separately fixed and accommodated in an annular housing, the housing is formed to be larger.

For the foregoing reasons, there is a need for a compact detection device capable of easily accommodating a light source, a battery, and an optical sensor including a plurality of photodiodes in an annular housing.

SUMMARY

According to an aspect, a detection device includes: an annular housing; a first flexible substrate provided along a shape of the annular housing; a battery provided on the first flexible substrate; a light source provided on the first flexible substrate; and an optical sensor including a second flexible substrate and a plurality of photodiodes provided in a detection area of the second flexible substrate. One end of the second flexible substrate of the optical sensor overlaps one end of the first flexible substrate, and the second flexible substrate is electrically coupled to the first flexible substrate.

BRIEF DESCRIPTION OF THE DRAWINGS

FIG. 14 is a sectional view of the optical sensor module according to a second embodiment before being accommodated in the housing;

FIG. 16 is a sectional view of the optical sensor module according to a third embodiment before being accommodated in the housing;

DETAILED DESCRIPTION

Figure 1:
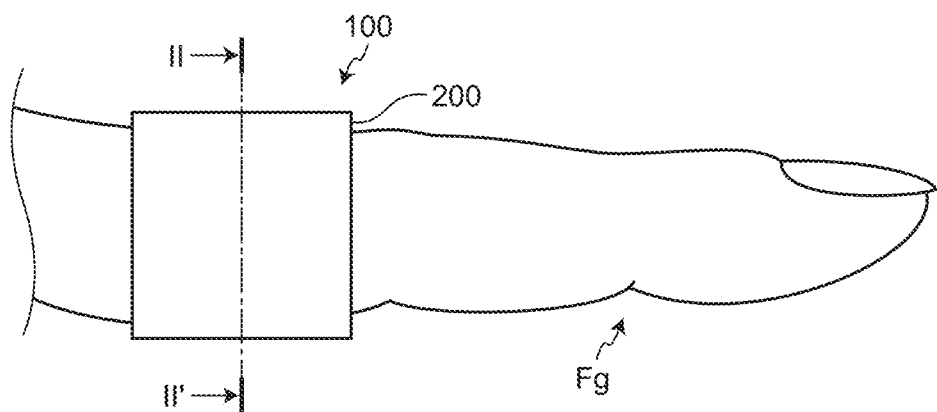
FIG. 1 is a schematic view illustrating an exemplary external appearance when a state of a finger accommodated inside a detection device according to a first embodiment is viewed from a lateral side of a housing.

The following describes modes (embodiments) for carrying out the invention in detail with reference to the drawings. The present disclosure is not limited to the description of the embodiments given below. Components described below include those easily conceivable by those skilled in the art or those substantially identical thereto. In addition, the components described below can be combined as appropriate. What is disclosed herein is merely an example, and the present disclosure naturally encompasses appropriate modifications easily conceivable by those skilled in the art while maintaining the gist of the invention. To further clarify the description, the drawings may schematically illustrate, for example, widths, thicknesses, and shapes of various parts as compared with actual aspects thereof. However, they are merely examples, and interpretation of the present disclosure is not limited thereto. The same component as that described with reference to an already mentioned drawing is denoted by the same reference numeral through the present specification and the drawings, and detailed description thereof may not be repeated where appropriate.

In the present disclosure, in expressing an aspect of disposing another structure on or above a certain structure, a case of simply expressing "on" includes both a case of disposing the other structure immediately on the certain structure so as to contact the certain structure and a case of disposing the other structure above the certain structure with still another structure interposed therebetween, unless otherwise specified.

First Embodiment

Figure 2:
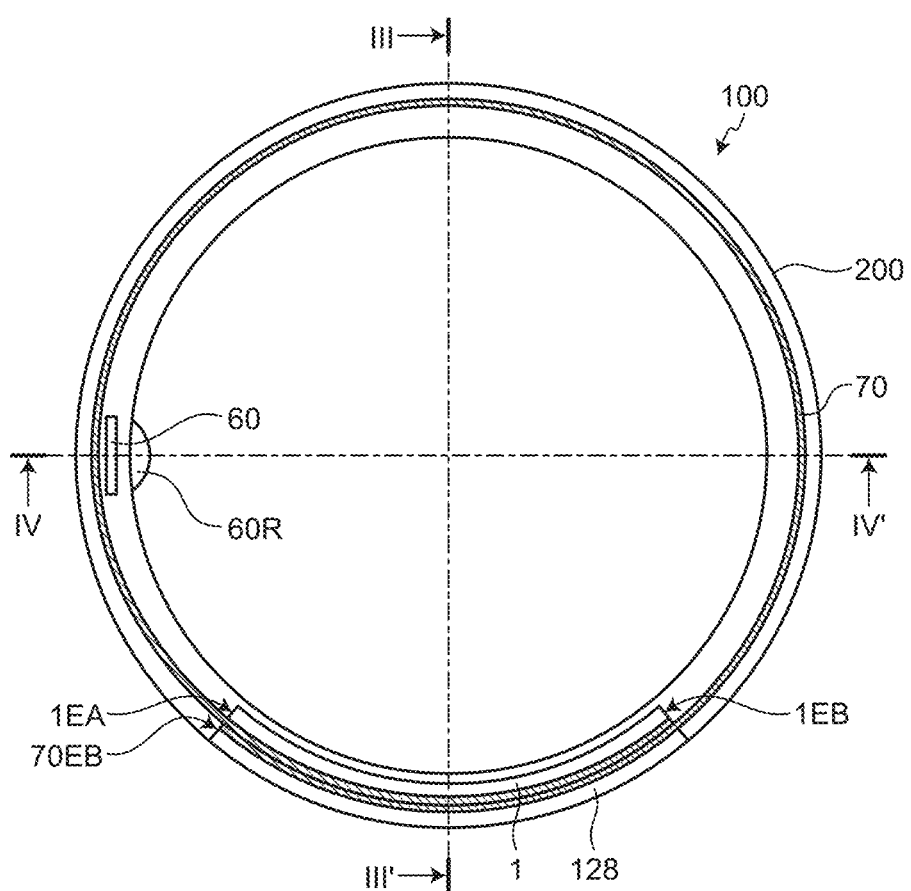
FIG. 2 is a sectional view taken along II-II' illustrated in FIG. 1.
Figure 3:
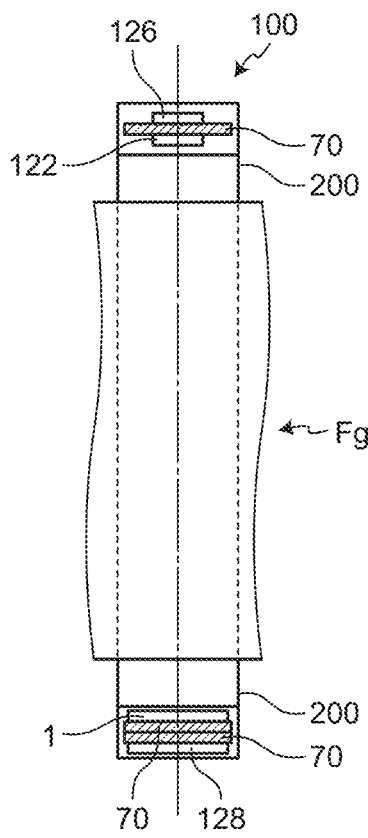
FIG. 3 is a sectional view taken along III-III' illustrated in FIG. 2.
Figure 4:
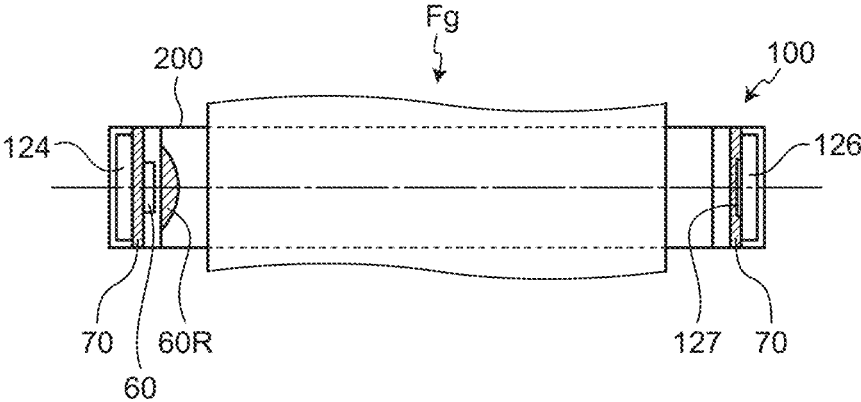
FIG. 4 is a sectional view taken along IV-IV' illustrated in FIG. 2.

FIG. 1 is a schematic view illustrating an exemplary external appearance when a state of a finger accommodated inside a detection device according to a first embodiment is viewed from a lateral side of a housing. FIG. 2 is a sectional view taken along II-II' illustrated in FIG. 1. FIG. 3 is a sectional view taken along III-III' illustrated in FIG. 2. FIG. 4 is a sectional view taken along IV-IV' illustrated in FIG. 2.

A detection device 100 illustrated in FIGS. 1 and 2 is a finger ring-shaped device that can be worn on and removed from a human body and is worn on an object to be detected Fg of the human body. The object to be detected Fg of the first embodiment is a digit (finger or the like), and may be any one of a thumb, an index finger, a middle finger, a ring finger, and a little finger. The detection device 100 can detect biometric information on a living body from the object to be detected Fg wearing the detection device 100.

As illustrated in FIG. 2, the detection device 100 includes a housing 200 and at least a light source 60 and an optical sensor 1 provided on at least a first flexible substrate 70. The housing 200 accommodates therein the light source 60 and the optical sensor 1. FIG. 2 does not illustrate components other than the housing 200, the first flexible substrate 70, the light source 60, a light emitter 60R, and the optical sensor 1.

The housing 200 is formed in a ring shape (annular shape) that can be worn on the object to be detected Fg, and is a wearable member worn on the living body. The housing 200 is formed of a housing material such as a synthetic resin. The outer surface of the housing 200 is a light-blocking resin. As a result, noise by external light is reduced. The inner surface of the housing 200 is a light-transmitting resin. As a result, light emitted by the light source 60 can irradiate the object to be detected Fg, and light from the object to be detected Fg can be received by the optical sensor 1.

In the first embodiment, a case will be described where the light source 60 and the optical sensor 1 are disposed away from each other so that the angle formed between an imaginary line connecting the light source 60 to the center of the housing 200 and an imaginary line connecting the optical sensor 1 to the center of the housing 200 is 90 degrees, but the present disclosure is not limited to this case. The angle formed between the imaginary line connecting the light source 60 to the center of the housing 200 and the imaginary line connecting the optical sensor 1 to the center of the housing 200 may be an acute angle or an obtuse angle.

As illustrated in FIGS. 2 and 3, the optical sensor 1 is disposed inwardly with respect to the first flexible substrate 70 so that the optical sensor 1 can receive the light from the object to be detected Fg. As illustrated in FIG. 3, a control circuit 123 is disposed on the outside of the first flexible substrate 70.

As illustrated in FIGS. 2 and 4, the light of the light source 60 is emitted to the object to be detected Fg through the inwardly projecting light emitter 60R. The light emitter 60R is a light-transmitting convex lens, for example. As illustrated in FIG. 4, a control circuit 124 is disposed outside the first flexible substrate 70.

Figure 5:
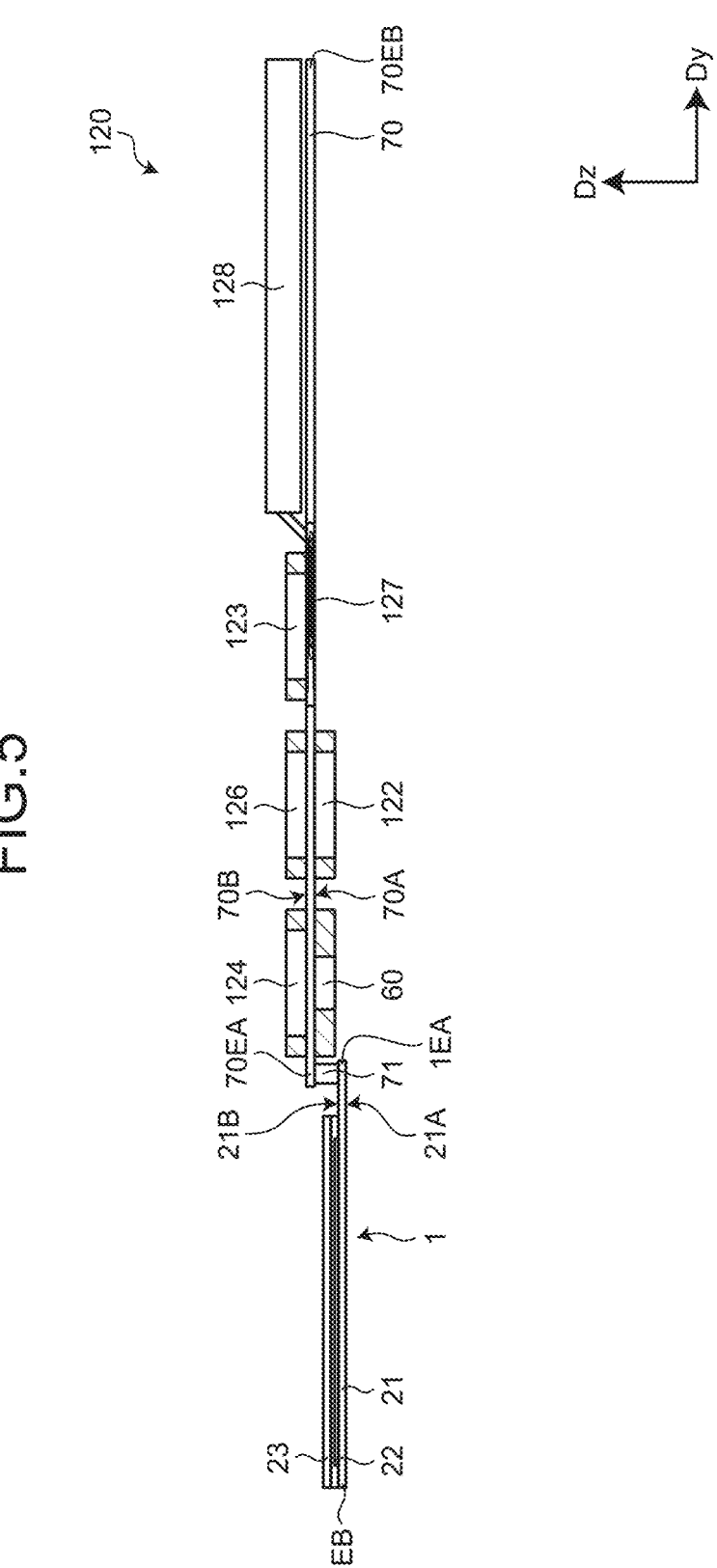
FIG. 5 is a sectional view of an optical sensor module according to the first embodiment before being accommodated in the housing.
Figure 6:
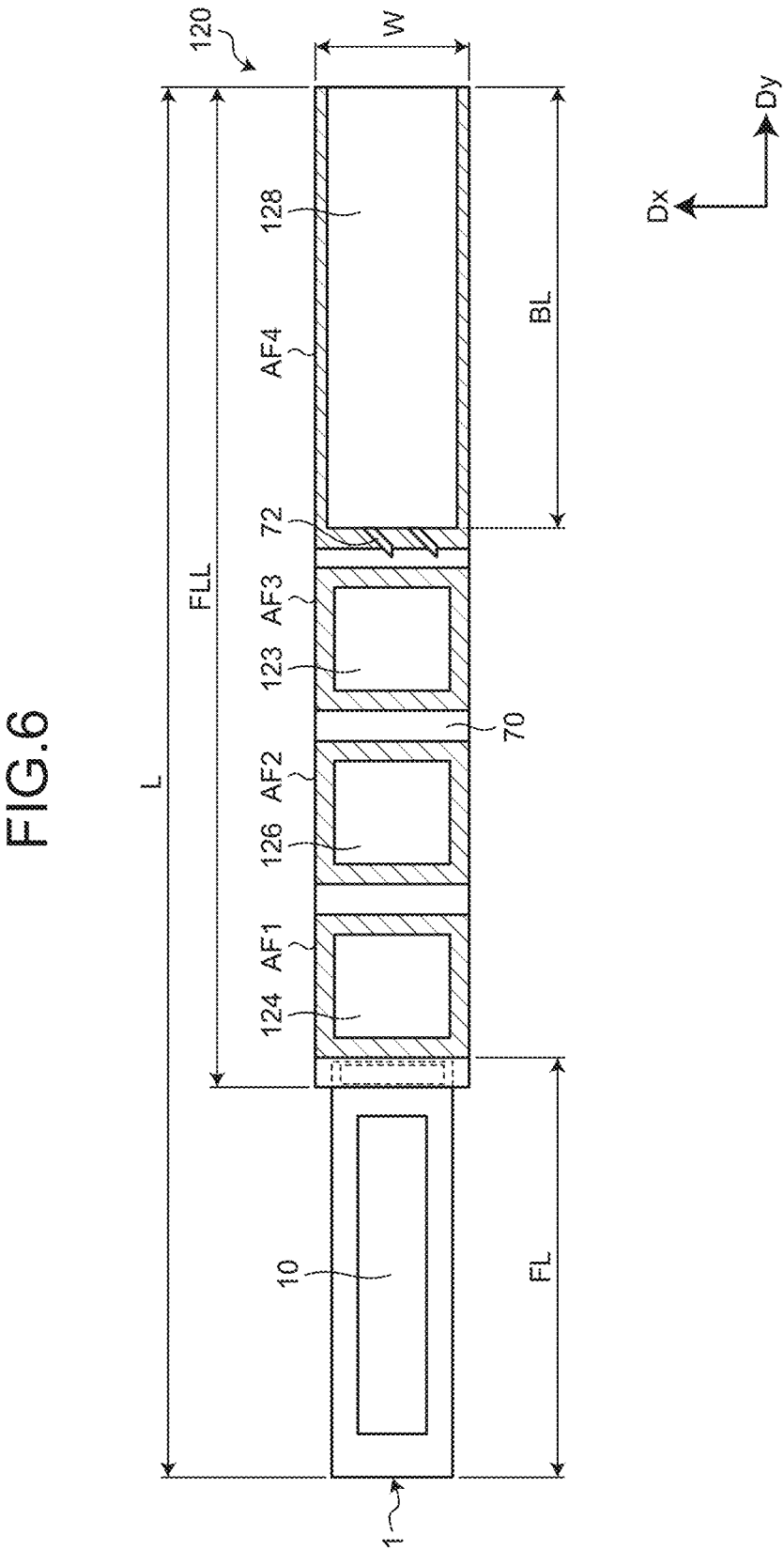
FIG. 6 is a top view of the optical sensor module of FIG. 5.
Figure 7:
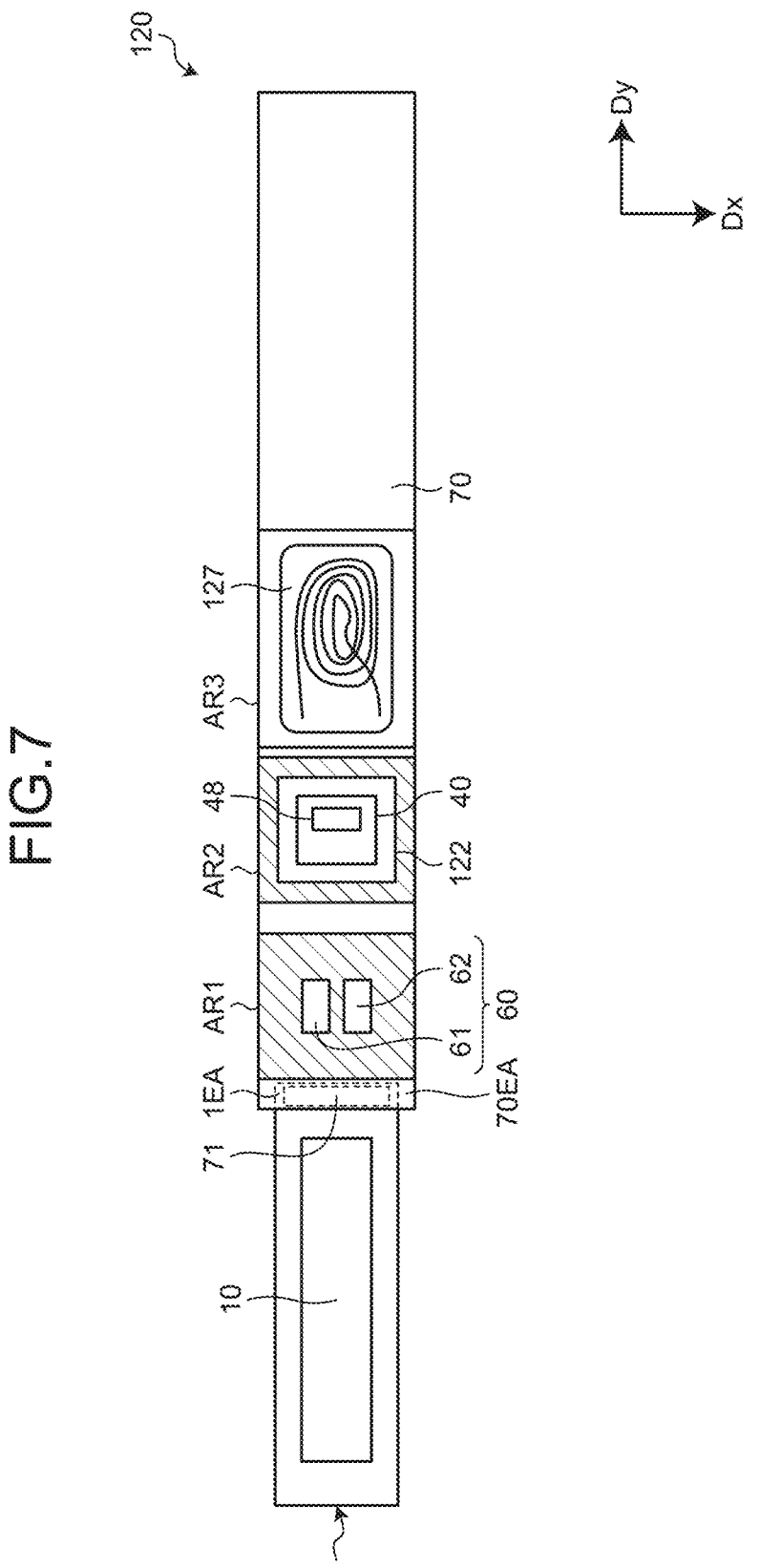
FIG. 7 is a bottom view of the optical sensor module of FIG. 5.

FIG. 5 is a sectional view of an optical sensor module according to the first embodiment before being accommodated in the housing. FIG. 6 is a top view of the optical sensor module of FIG. 5. FIG. 7 is a bottom view of the optical sensor module of FIG. 5.

As illustrated in FIGS. 2, 3, 4, 5, 6, and 7, in an optical sensor module 120, the optical sensor 1, the light source 60, a control circuit 122, the control circuit 123, the control circuit 124, a control circuit 126, a battery charging coil 127, and a battery 128 are assembled on the first flexible substrate 70.

Figure 8:
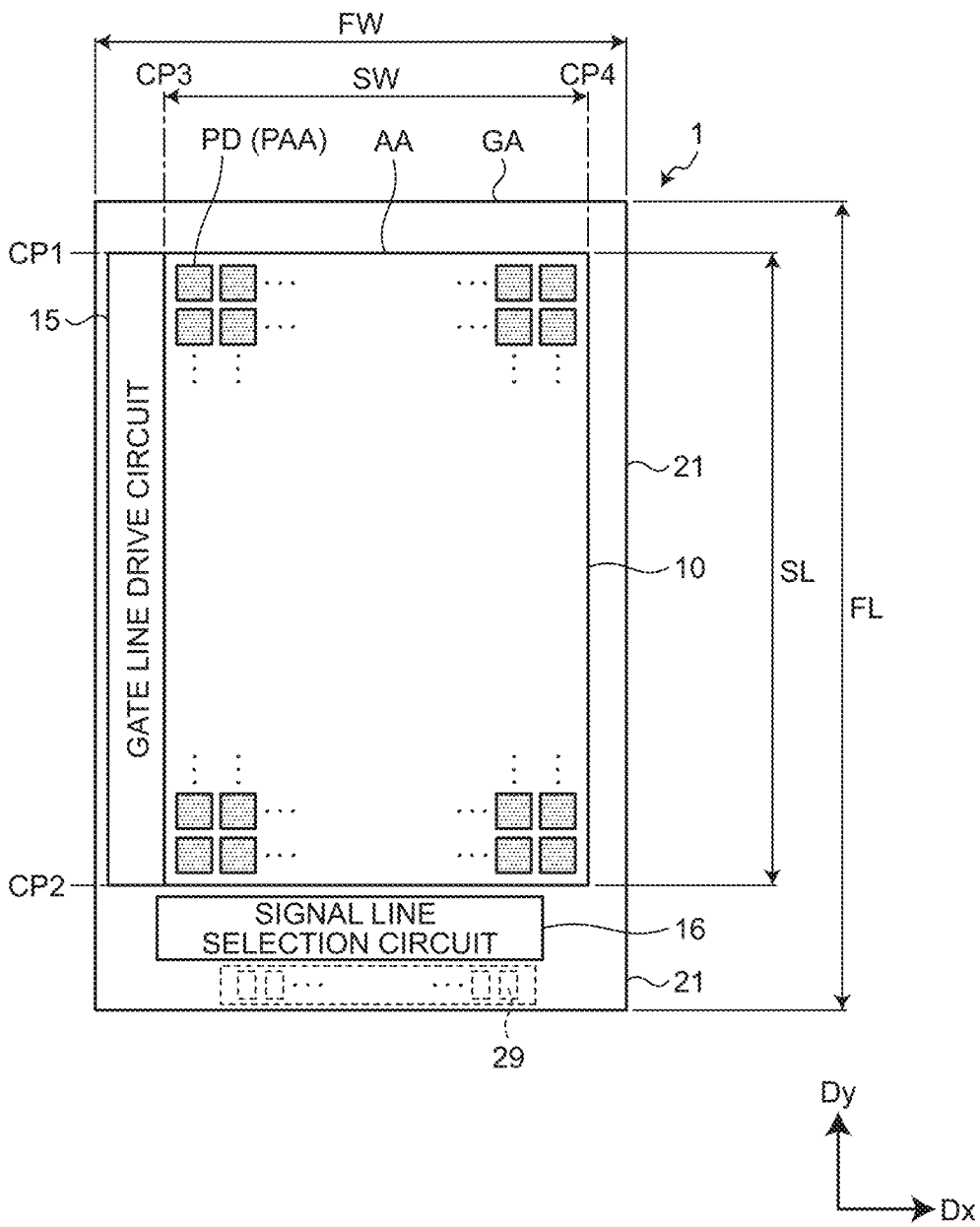
FIG. 8 is a configuration diagram illustrating an optical sensor of the first embodiment.

As illustrated in FIG. 8, a width FW in a first direction Dx of a second flexible substrate 21 is larger than a width SW of a sensor area 10, and a length FL in a second direction Dy of the second flexible substrate 21 is larger than a length SL of the sensor area 10. The width FW in the first direction Dx of the optical sensor 1 is equal to or smaller than a width W in the first direction Dx of the first flexible substrate 70, and the length FL in the second direction Dy of the optical sensor 1 is smaller than a length FLL in the second direction Dy of the first flexible substrate 70.

The light source 60 is provided in a first area AR1 of a second surface 70A of the first flexible substrate 70. One end 1EA of the optical sensor 1 is provided so as to overlap one end 70EA of the first flexible substrate 70. This configuration makes a length L in the second direction Dy of the optical sensor module 120 smaller than the sum of the length FL in the second direction Dy of the optical sensor 1 and the length FLL in the second direction Dy of the first flexible substrate 70.

The battery charging coil 127 for charging the battery 128 is formed by winding a conductor in a third area AR3 of the second surface 70A of the first flexible substrate 70. The battery charging coil 127 is disposed in a position that is different from those of the light source 60 and the battery 128 and is between the light source 60 and the battery 128. The control circuit 122 is provided in a second area AR2 of the second surface 70A of the first flexible substrate 70.

The control circuit 124 is provided in a first area AF1 of a first surface 70B of the first flexible substrate 70. The control circuit 126 is provided in a second area AF2 of the first surface 70B of the first flexible substrate 70. The control circuit 123 is provided in a third area AF3 of the first surface 70B of the first flexible substrate 70.

As illustrated in FIG. 6, the battery 128 is a film-type lithium-ion battery that can be curved. The battery 128 is provided in a fourth area AF4 of the first surface 70B of the first flexible substrate 70. The width in the first direction Dx of the battery 128 is equal to or smaller than the width W in the first direction Dx of the first flexible substrate 70, and a length BL in the second direction Dy of the battery 128 is smaller than the length L in the second direction Dy of the first flexible substrate 70. This configuration allows the battery 128 to be mounted on the first flexible substrate 70 so as not to protrude from the first flexible substrate 70.

The control circuit 124 is disposed in the first area AF1 opposite the first area AR1 of the first flexible substrate 70. The control circuit 124 controls the light emission of the light source 60. Therefore, the light source 60 can be electrically coupled to the control circuit 124 with a short distance between the light source 60 and the control circuit 124, thus reducing unnecessary noise.

The control circuit 122 including a detection circuit 48 is disposed on the second surface 70A of the first flexible substrate 70 and is disposed in the second area AR2 adjacent to the optical sensor 1.

The control circuit 122 may be disposed in the third area AF, and the control circuit 123 may be disposed in the second area AR2. The detection circuit 48 is disposed opposite the optical sensor 1 on the first flexible substrate 70, allowing the optical sensor 1 to be electrically coupled to the detection circuit 48 with a short distance between the optical sensor 1 and the detection circuit 48, thus reducing unnecessary noise.

As illustrated in FIG. 7, for example, inorganic light-emitting diodes (LEDs) or organic electroluminescent (EL) diodes (organic light-emitting diodes (OLEDs)) are used as the light source 60. The light source 60 emits light having predetermined wavelengths. In the present embodiment, the light source 60 includes a first light source 61 that emits red light and a second light source 62 that emits near-infrared light. First light has a wavelength of, for example, approximately 660 nm, and second light has a wavelength of, for example, approximately 850 nm.

The optical sensor 1 can detect a blood oxygen level in addition to pulse waves, pulsation, and a vascular image as the information on the living body based on the first light emitted from the first light source 61 and the second light emitted from the second light source 62. Red blood cells contained in blood contain hemoglobin. The near-infrared light emitted from the light source 60 is easily absorbed by hemoglobin. In other words, the coefficient of absorption of the near-infrared light by hemoglobin is higher than that by the other portions in the body. Therefore, a vascular pattern of veins and the like can be detected by reading the amount of light received by a plurality of photodiodes PD and identifying places where the amount of the near-infrared light received is relatively smaller.

Reflected light of the near-infrared and the red light contains information for measuring an oxygen saturation level in blood (hereinafter, referred to as "blood oxygen saturation level ($SpO_2$)"). The blood oxygen saturation level ($SpO_2$) refers to a ratio of an amount of oxygen actually bound to hemoglobin to the total amount of oxygen under the assumption that the oxygen is bound to all the hemoglobin in the blood. In calculating the blood oxygen saturation level ($SpO_2$), the pulse waves acquired using the first light and the pulse waves acquired using the second light are used.

Hemoglobin in blood includes oxygenated hemoglobin and reduced hemoglobin. The blood oxygen saturation level ($SpO_2$) is determined by the ratio of hemoglobin in blood bound to oxygen (oxygenated hemoglobin ($O_2Hb$)) to hemoglobin in blood not bound to oxygen (reduced hemoglobin (HHb)).

The light absorption characteristics of the red light are represented as $HHb \gg O_2Hb$, indicating that HHb has significantly higher absorbance, while the light absorption characteristics of the near-infrared light are represented as $HHb \approx O_2Hb$, and $O_2Hb$ has slightly higher absorbance.

Using this difference in light absorption characteristics, the blood oxygen saturation level ($SpO_2$) can be evaluated using the ratio of the measurement value of the near-infrared light to the measurement value of the red light.

In the present disclosure, the light emitted from the light source 60 is not limited to the light described above. The light source 60 may emit only near-infrared light having a wavelength of 800 nm or larger and smaller than 1000 nm, or only red light having a wavelength of 600 nm or larger and smaller than 800 nm, depending on the application.

The optical sensor 1 includes the second flexible substrate 21, a sensor structure 22 formed on the second flexible substrate 21, and a protective film 23 covering the sensor structure 22.

FIG. 8 is a configuration diagram illustrating the optical sensor of the first embodiment. As illustrated in FIG. 8, the optical sensor 1 is an optical sensor including the photodiodes PD that are photoelectric conversion elements. Each of the photodiodes PD included in the optical sensor 1 outputs an electrical signal corresponding to light emitted thereto as a detection signal Vdet to a signal line selection circuit 16. The optical sensor 1 performs detection in response to a gate drive signal Vgcl supplied from a gate line drive circuit 15.

Figure 9:
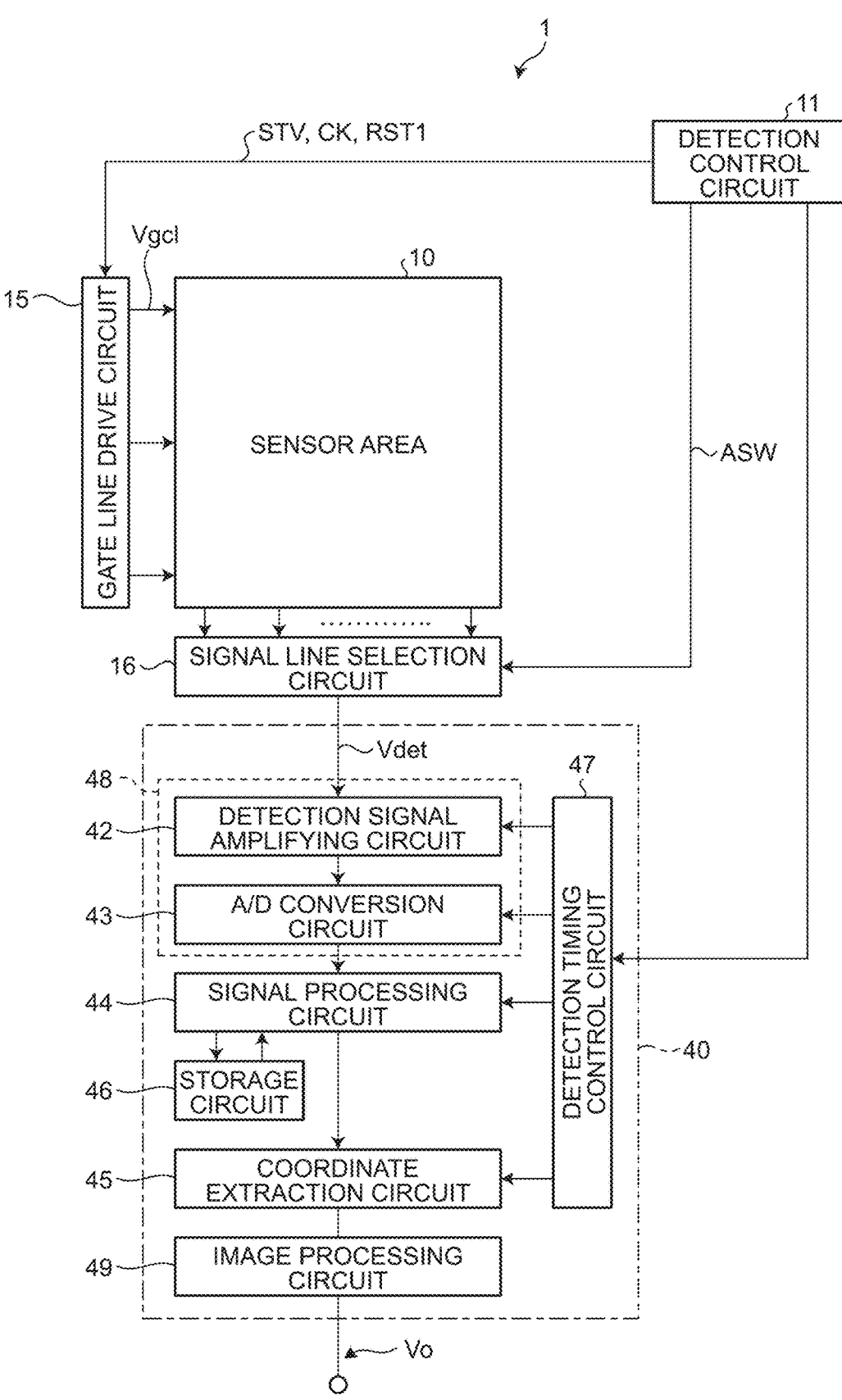
FIG. 9 is a block diagram illustrating an exemplary configuration of the optical sensor of the first embodiment.

The control circuit 122 includes the detection circuit 48 (refer to FIG. 9). The control circuit 122 is a field-programmable gate array (FPGA), for example. A second coupling terminal 29 of the second flexible substrate 21 is electrically coupled to the control circuit 122 of the first flexible substrate 70 through an anisotropic conductive film (ACF) 71 (refer to FIG. 5).

The control circuit 122 supplies control signals to the optical sensor 1, the gate line drive circuit 15, and the signal line selection circuit 16 to control detection operations of the sensor area 10 (refer to FIG. 9) in the optical sensor 1.

The control circuit 123 for charging performs power control by wireless power transmission by which electrical energy electromagnetically reaches the battery charging coil 127 from outside. One of an electromagnetic induction method, an electromagnetic resonance method, and a radio wave method is selected as a method of coupling for the wireless power transmission. The control circuit 123 charges the battery 128 using the power transmitted by the wireless power transmission.

The control circuit 124 supplies a control signal to the light source 60 to control lighting and non-lighting of the light source 60. The control circuit 124 supplies a power supply voltage to the light source 60.

The control circuit 126 that performs the power supply management supplies voltage signals such as a sensor power supply signal (sensor power supply voltage) VDDSNS (refer to FIG. 11) to the optical sensor 1, the gate line drive circuit 15, and the signal line selection circuit 16 based on the power of the battery 128.

The second flexible substrate 21 has a detection area AA and a peripheral area GA. The detection area AA is an area provided with the photodiodes PD included in the optical sensor 1. The peripheral area GA is an area between the outer perimeter of the detection area AA and the ends of the second flexible substrate 21, and is an area not overlapping the photodiodes PD.

Boundaries between the rectangular detection area AA and the peripheral area GA are sides CP1, CP2, CP3, and CP4 of the detection area AA. The width SW in the first direction Dx of the detection area AA is the distance between the sides CP3 and CP4. The length SL in the second direction Dy of detection area AA is the distance between the sides CP1 and CP2. The width FW in the first direction Dx of the second flexible substrate 21 is larger than the width SW, and the length FL in the second direction Dy of the second flexible substrate 21 is larger than the length SL.

The gate line drive circuit 15 and the signal line selection circuit 16 are provided in the peripheral area GA. Specifically, the gate line drive circuit 15 is provided in an area extending along the second direction Dy in the peripheral area GA. The signal line selection circuit 16 is provided in an area extending along the first direction Dx in the peripheral area GA, and is provided between the optical sensor 1 and the detection circuit 48.

The first direction Dx is one direction in a plane parallel to the second flexible substrate 21. The second direction Dy is one direction in the plane parallel to the second flexible substrate 21, and is a direction orthogonal to the first direction Dx. The second direction Dy may non-orthogonally intersect the first direction Dx. A third direction Dz is a direction orthogonal to the first direction Dx and the second direction Dy, and is a direction normal to the second flexible substrate 21.

FIG. 9 is a block diagram illustrating an exemplary configuration of the optical sensor of the first embodiment. As illustrated in FIG. 9, the detection device 100 further includes a detection control circuit 11 and a detector 40. The control circuit 122 includes one, some, or all functions of the detection control circuit 11. The control circuit 122 also includes one, some, or all functions of the detector 40 other than those of the detection circuit 48.

The detection control circuit 11 is a circuit that supplies respective control signals to the gate line drive circuit 15, the signal line selection circuit 16, and the detector 40 to control operations of these components. The detection control circuit 11 supplies various control signals such as a start signal STV, a clock signal CK, and a reset signal RST1 to the gate line drive circuit 15. The detection control circuit 11 also supplies various control signals such as a selection signal ASW to the signal line selection circuit 16. The detection control circuit 11 also supplies various control signals to the light source 60 to control the lighting and non-lighting of each of the light sources thereof.

The gate line drive circuit 15 is a circuit that drives a plurality of gate lines GCL (refer to FIG. 10) based on the various control signals. The gate line drive circuit 15 sequentially or simultaneously selects the gate lines GCL, and supplies the gate drive signals Vgcl to the selected gate lines GCL. Through this operation, the gate line drive circuit 15 selects the photodiodes PD coupled to the gate lines GCL.

Figure 11:
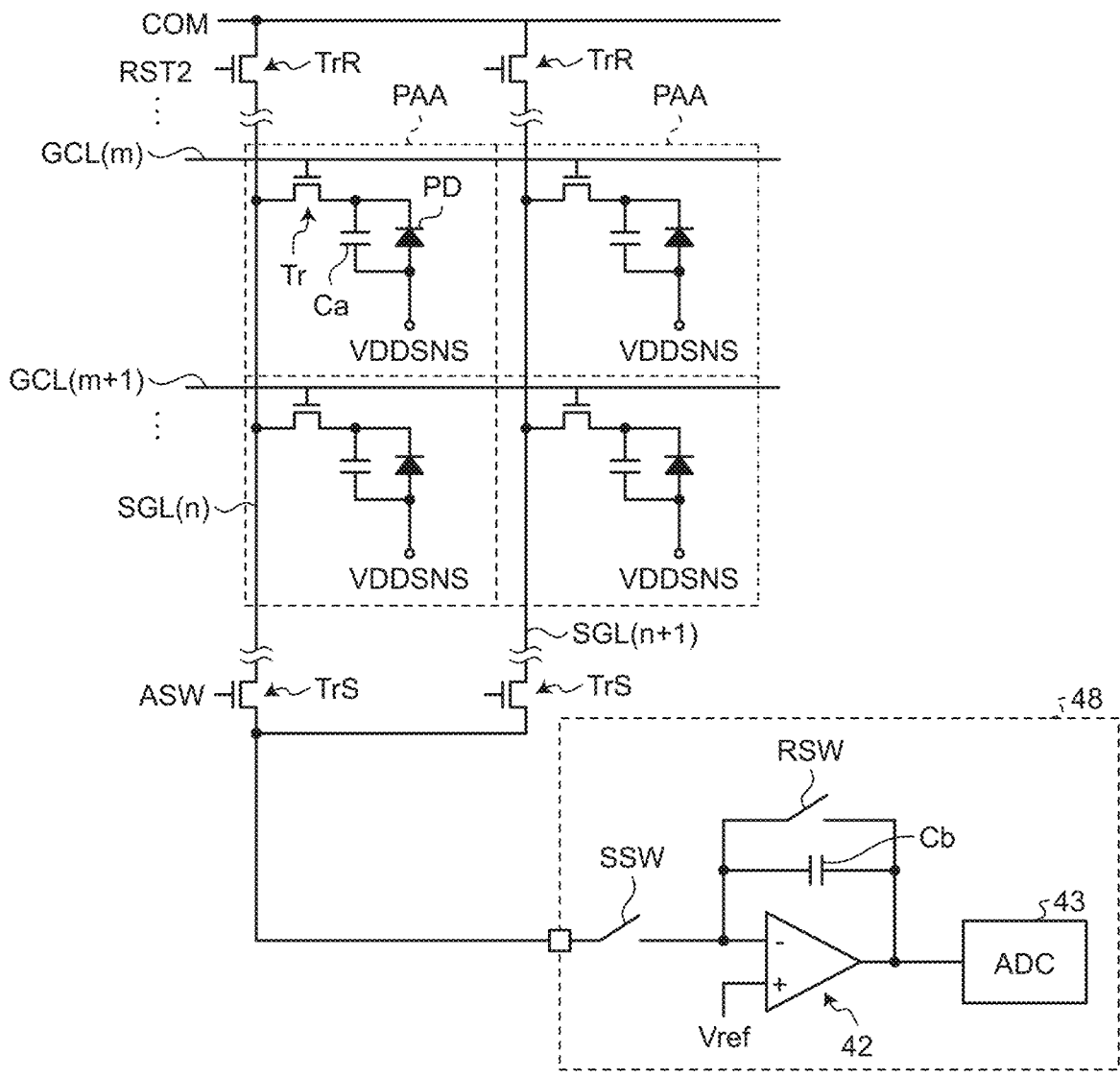
FIG. 11 is a circuit diagram illustrating sensor detection areas.

The signal line selection circuit 16 is a switch circuit that sequentially or simultaneously selects a plurality of signal lines SGL (refer to FIG. 11). The signal line selection circuit 16 is a multiplexer, for example. The signal line selection circuit 16 couples the selected signal lines SGL to the detection circuit 48 based on the selection signal ASW supplied from the detection control circuit 11. Through this operation, the signal line selection circuit 16 outputs the detection signals Vdet of the photodiodes PD to the detector 40.

The detector 40 includes the detection circuit 48, a signal processing circuit 44, a coordinate extraction circuit 45, a storage circuit 46, a detection timing control circuit 47, and an image processing circuit 49. The detection timing control circuit 47 performs control to synchronously operate the detection circuit 48, the signal processing circuit 44, the coordinate extraction circuit 45, and the image processing circuit 49 based on a control signal supplied from the detection control circuit 11.

The detection circuit 48 is an analog front-end (AFE) circuit, for example. The detection circuit 48 is a signal processing circuit having functions of at least a detection signal amplifying circuit 42 and an analog-to-digital (A/D) conversion circuit 43. The detection signal amplifying circuit 42 amplifies the detection signal Vdet. The A/D conversion circuit 43 converts analog signals output from the detection signal amplifying circuit 42 into digital signals.

The signal processing circuit 44 is a logic circuit that detects predetermined physical quantities received by the optical sensor 1 based on output signals of the detection circuit 48. The signal processing circuit 44 can detect asperities on a biological surface of the object to be detected Fg or a palm based on the signals from the detection circuit 48 when the object to be detected Fg is in contact with or in proximity to a detection surface. The signal processing circuit 44 can detect the information on the living body based on the signals from the detection circuit 48. Examples of the information on the living body include, but are not limited to, the pulsation and the blood oxygen saturation level of the object to be detected Fg.

The signal processing circuit 44 may also perform processing of acquiring the detection signals Vdet (information on the living body) simultaneously detected by the photodiodes PD, and averaging the detection signals Vdet. In this case, the detector 40 can perform stable detection by reducing measurement errors caused by noise or relative positional misalignment between an object to be detected such as the object to be detected Fg and the optical sensor 1.

The storage circuit 46 temporarily stores therein signals calculated by the signal processing circuit 44. The storage circuit 46 may be, for example, a random-access memory (RAM) or a register circuit.

The coordinate extraction circuit 45 is a logic circuit that obtains detected coordinates of the asperities on the biological surface of the finger or the like when contact or proximity of the finger is detected by the signal processing circuit 44. The coordinate extraction circuit 45 is the logic circuit that also obtains detected coordinates of blood vessels in the object to be detected Fg or the palm. The image processing circuit 49 combines the detection signals Vdet output from the photodiodes PD of the optical sensor 1 to generate two-dimensional information indicating the shape of the asperities on the biological surface of the object to be detected Fg or the like and two-dimensional information indicating the shape of the blood vessels in the object to be detected Fg or the palm. The coordinate extraction circuit 45 may output the detection signals Vdet as sensor output voltages Vo instead of calculating the detected coordinates. A case may be considered where the detector 40 does not include the coordinate extraction circuit 45 and the image processing circuit 49.

The detection control circuit 11 has a function to compare the detected information on the living body with authentication information stored in advance and authenticate a person to be authenticated based on the result of the comparison. The detection control circuit 11 has a function to control transmission of the detected information on the living body to an external device through a communication device, which is not illustrated.

Figure 10:
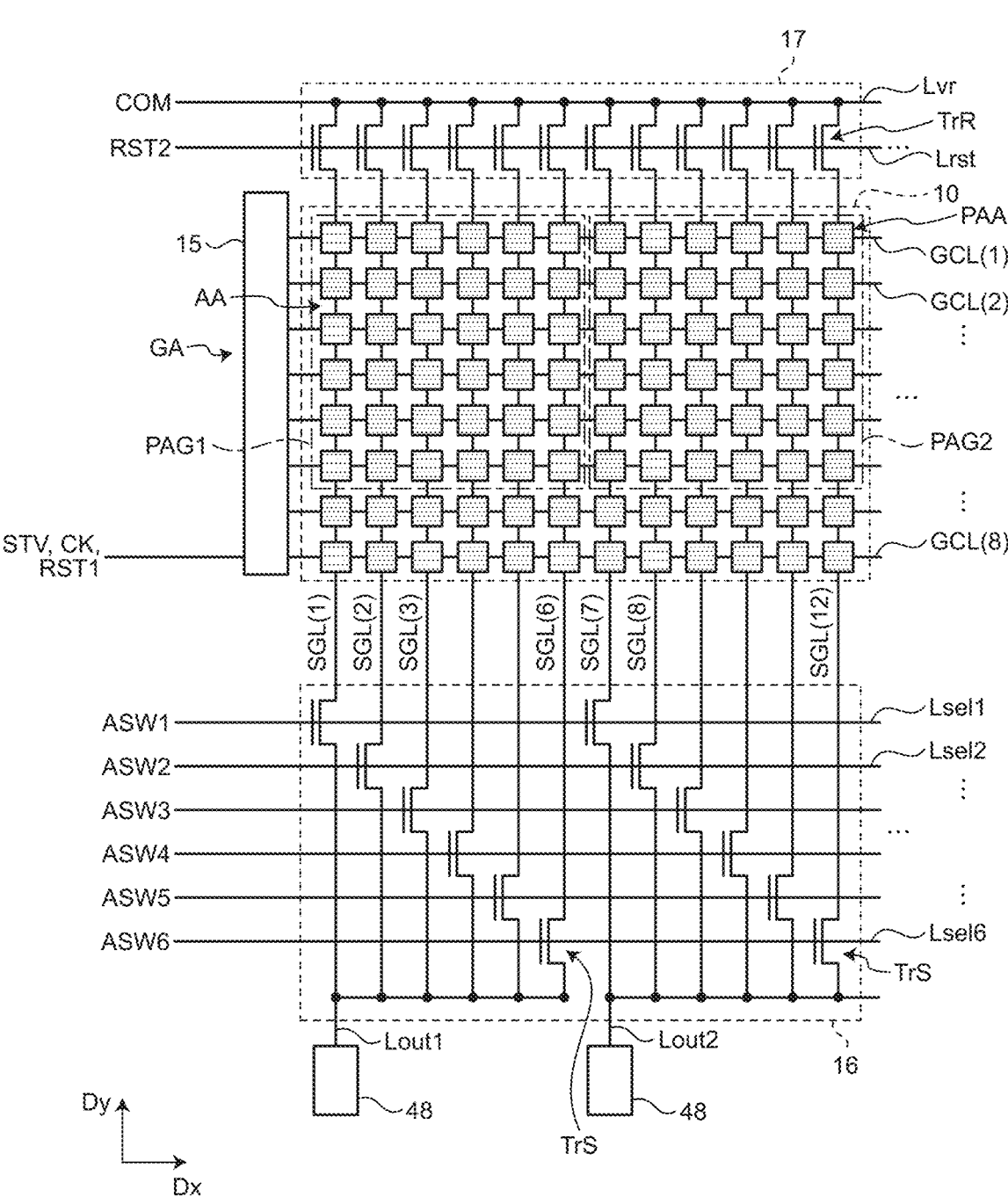
FIG. 10 is a circuit diagram of the optical sensor of the first embodiment.

The following describes an exemplary circuit configuration of the detection device 100. FIG. 10 is a circuit diagram of the optical sensor of the first embodiment. FIG. 11 is a circuit diagram illustrating sensor detection areas. FIG. 11 also illustrates a circuit configuration of the detection circuit 48.

As illustrated in FIG. 10, the optical sensor 1 has a plurality of unit detection areas PAA arranged in a matrix having a row-column configuration. Each of the unit detection areas PAA is provided with the photodiode PD.

The gate lines GCL extend in the first direction Dx and are each coupled to switching elements in the unit detection areas PAA arranged in the first direction Dx. A plurality of gate lines GCL(1), GCL(2), . . . , GCL(8) are arranged in the second direction Dy and are each coupled to the gate line drive circuit 15. In the following description, the gate lines GCL(1), GCL(2), . . . , GCL(8) will each be simply referred to as the gate line GCL when need not be distinguished from one another. To facilitate understanding of the description, FIG. 11 illustrates eight gate lines GCL. However, this is merely an example, and M gate lines GCL may be arranged (where M is 8 or larger, and is, for example, 256).

The signal lines SGL extend in the second direction Dy and are each coupled to the photodiodes PD in the unit detection areas PAA arranged in the second direction Dy. A plurality of signal lines SGL(1), SGL(2), . . . , SGL(12) are arranged in the first direction Dx and are each coupled to the signal line selection circuit 16 and a reset circuit 17. In the following description, the signal lines SGL(1), SGL(2), . . . , SGL(12) will each be simply referred to as the signal line SGL when need not be distinguished from one another.

To facilitate understanding of the description, 12 signal lines SGL are illustrated. However, this is merely an example, and N signal lines SGL may be arranged (where N is 12 or larger, and is, for example, 252). In FIG. 10, the sensor area 10 is provided between the signal line selection circuit 16 and the reset circuit 17. The signal line selection circuit 16 and the reset circuit 17 are not limited to this configuration, and may be coupled to ends of the signal lines SGL in the same direction.

The gate line drive circuit 15 receives the various control signals such as the start signal STV, the clock signal CK, and the reset signal RST1 from the control circuit 122 (refer to FIG. 5). The gate line drive circuit 15 sequentially selects the gate lines GCL(1), GCL(2), . . . , GCL(8) in a time-division manner based on the various control signals. The gate line drive circuit 15 supplies the gate drive signal Vgcl to the selected one of the gate lines GCL. This operation supplies the gate drive signal Vgcl to a plurality of first switching elements Tr coupled to the gate line GCL, and corresponding ones of the unit detection areas PAA arranged in the first direction Dx are selected as detection targets.

The gate line drive circuit 15 may perform different driving for each of detection modes including the detection of a fingerprint or a thumbprint and the detection of different items of the information on the living body (such as the pulsation and the blood oxygen saturation level). For example, the gate line drive circuit 15 may collectively drive more than one of the gate lines GCL.

Specifically, the gate line drive circuit 15 simultaneously selects a predetermined number of the gate lines GCL from among the gate lines GCL(1), GCL(2), . . . , GCL(8) based on the control signals. For example, the gate line drive circuit 15 simultaneously selects six gate lines GCL(1) to GCL(6) and supplies thereto the gate drive signals Vgcl. The gate line drive circuit 15 supplies the gate drive signals Vgcl through the selected six gate lines GCL to the first switching elements Tr. Through this operation, detection area groups PAG1 and PAG2 each including more than one of the unit detection areas PAA arranged in the first direction Dx and the second direction Dy are selected as the detection targets. The gate line drive circuit 15 collectively drives the predetermined number of the gate lines GCL and sequentially supplies the gate drive signals Vgcl to each unit of the predetermined number of the gate lines GCL.

The signal line selection circuit 16 includes a plurality of selection signal lines Lsel, a plurality of output signal lines Lout, and third switching elements TrS. The third switching elements TrS are provided correspondingly to the respective signal lines SGL. Six signal lines SGL(1), SGL(2), . . . , SGL(6) are coupled to the same output signal line Lout1. Six signal lines SGL(7), SGL(8), SGL(12) are coupled to the same output signal line Lout2. The output signal lines Lout1 and Lout2 are each coupled to the detection circuit 48.

The signal lines SGL(1), SGL(2), . . . , SGL(6) are grouped into a first signal line block, and the signal lines SGL(7), SGL(8), . . . , SGL(12) are grouped into a second signal line block. The selection signal lines Lsel are coupled to the gates of the respective third switching elements TrS included in one of the signal line blocks. One of the selection signal lines Lsel is coupled to the gates of the third switching elements TrS in the signal line blocks.

Specifically, selection signal lines Lsel1, Lsel2, . . . , Lsel6 are coupled to the third switching elements TrS corresponding to the signal lines SGL(1), SGL(2), . . . , SGL(6), respectively. The selection signal line Lsel1 is coupled to the third switching element TrS corresponding to the signal line SGL(1) and the third switching element TrS corresponding to the signal line SGL(7). The selection signal line Lsel2 is coupled to the third switching element TrS corresponding to the signal line SGL(2) and the third switching element TrS corresponding to the signal line SGL(8).

The control circuit 122 (refer to FIG. 5) sequentially supplies the selection signal ASW to the selection signal lines Lsel. This operation causes the signal line selection circuit 16 to operate the third switching elements TrS to sequentially select the signal lines SGL in one of the signal line blocks in a time-division manner. The signal line selection circuit 16 selects one of the signal lines SGL in each of the signal line blocks.

The signal line selection circuit 16 may couple more than one of the signal lines SGL collectively to the detection circuit 48. Specifically, the control circuit 122 (refer to FIG. 5) simultaneously supplies the selection signal ASW to more than one of the selection signal lines Lsel. This operation causes the signal line selection circuit 16 to operate the third switching elements TrS to select the signal lines SGL (for example, six of the signal lines SGL) in one of the signal line blocks, and couple the signal lines SGL to the detection circuit 48. As a result, signals detected by the detection area groups PAG1 and PAG2 are output to the detection circuit 48. In this case, the signals from the unit detection areas PAA (photodiodes PD) included in the detection area groups PAG1 and PAG2 are integrated and output to the detection circuit 48.

By the operations of the gate line drive circuit 15 and the signal line selection circuit 16, the detection is performed for each of the detection area groups PAG1 and PAG2. As a result, the intensity of the detection signal Vdet obtained by a one-time detection operation increases, so that the sensor sensitivity can be improved. In addition, time required for the detection can be reduced. As a result, the detection device 100 can repeatedly perform the detection in a short time, and thus, can improve a signal-to-noise ratio (S/N), and can accurately detect a change over time of the information on the living body such as the pulse waves.

As illustrated in FIG. 10, the reset circuit 17 includes a reference signal line Lvr, a reset signal line Lrst, and fourth switching elements TrR. The fourth switching elements TrR are provided correspondingly to the signal lines SGL. The reference signal line Lvr is coupled to either the sources or the drains of the fourth switching elements TrR. The reset signal line Lrst is coupled to the gates of the fourth switching elements TrR.

The control circuit 122 supplies a reset signal RST2 to the reset signal line Lrst. This operation turns on the fourth switching elements TrR to electrically couple the signal lines SGL to the reference signal line Lvr. The control circuit 123 supplies a reference signal COM to the reference signal line Lvr. This operation supplies the reference signal COM to a capacitive element Ca (refer to FIG. 11) included in each of the unit detection areas PAA.

As illustrated in FIG. 11, each of the unit detection areas PAA includes the photodiode PD, the capacitive element Ca, and a corresponding one of the first switching elements Tr. FIG. 11 illustrates two gate lines GCL(m) and GCL(m+1) arranged in the second direction Dy among the gate lines GCL. FIG. 11 also illustrates two signal lines SGL(n) and SGL(n+1) arranged in the first direction Dx among the signal lines SGL. The unit detection area PAA is an area surrounded by the gate lines GCL and the signal lines SGL. The first switching element Tr is provided correspondingly to the photodiode PD. The first switching element Tr is made of a thin-film transistor, and in this example, made of an n-channel metal oxide semiconductor (MOS) thin-film transistor (TFT).

The gates of the first switching elements Tr belonging to the unit detection areas PAA arranged in the first direction Dx are coupled to the gate line GCL. The sources of the first switching elements Tr belonging to the unit detection areas PAA arranged in the second direction Dy are coupled to the signal line SGL. The drain of the first switching element Tr is coupled to the cathode of the photodiode PD and the capacitive element Ca.

The anode of the photodiode PD is supplied with the sensor power supply signal VDDSNS from the control circuit 123. The signal line SGL and the capacitive element Ca are supplied with the reference signal COM that serves as an initial potential of the signal line SGL and the capacitive element Ca from the control circuit 123.

When the unit detection area PAA is irradiated with light, a current corresponding to the amount of the light flows through the photodiode PD. As a result, the amount of an electric charge stored in the capacitive element Ca is determined. When the first switching element Tr is turned on, a current corresponding to the electric charge stored in the capacitive element Ca flows through the signal line SGL. The signal line SGL is coupled to the detection circuit 48 through a corresponding one of the third switching elements TrS of the signal line selection circuit 16. Thus, the detection device 100 can detect a signal corresponding to the amount of the light irradiating the photodiode PD in each of the unit detection areas PAA or in each of the detection area groups PAG1 and PAG2.

During a read period, a switch SSW is turned on to couple the detection circuit 48 to the signal line SGL. The detection signal amplifying circuit 42 of the detection circuit 48 converts a current supplied from the signal line SGL into a voltage corresponding to the value of the current, and amplifies the result. A reference voltage Vref having a fixed potential is supplied to a non-inverting input terminal (+) of the detection signal amplifying circuit 42, and the signal line SGL is coupled to an inverting input terminal (−) of the detection signal amplifying circuit 42. In the present embodiment, the same signal as the reference signal COM is supplied as the reference voltage Vref. The detection signal amplifying circuit 42 includes a capacitive element Cb and a reset switch RSW. During a reset period, the reset switch RSW is turned on, and the electric charge of the capacitive element Cb is reset.

The configuration described above allows the detection device 100 including the photodiodes PD to detect the information on the living body, such as a vein pattern, a dermatoglyphic pattern, the blood oxygen saturation level, and the pulsation of the object to be detected Fg, and supply the biometric information including the detected information to outside the device.

Figure 12:
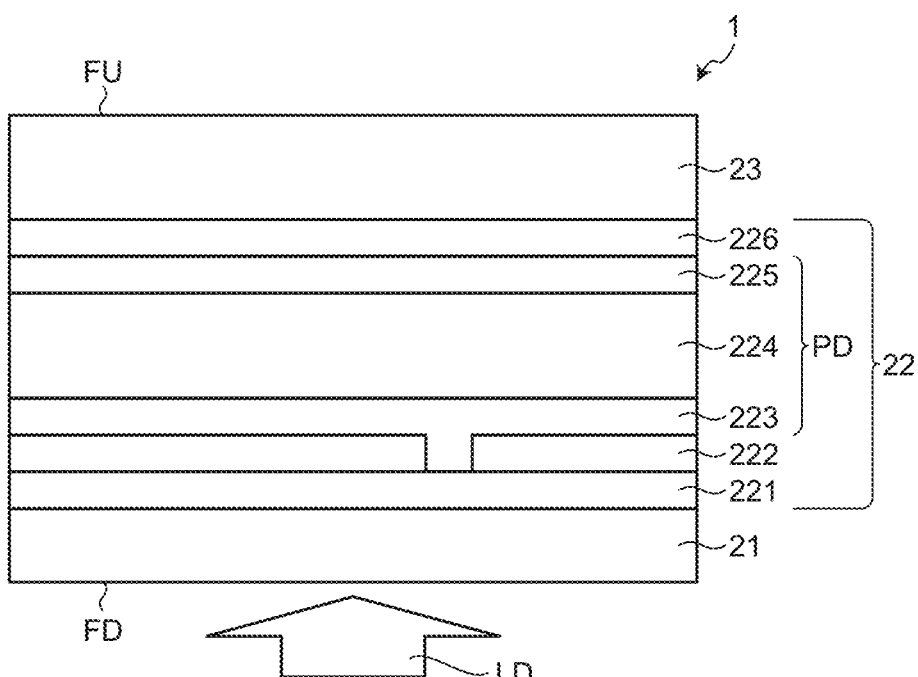
FIG. 12 is a schematic partial sectional view of the optical sensor of the first embodiment.

FIG. 12 is a schematic partial sectional view of the optical sensor of the first embodiment. The optical sensor 1 includes the second flexible substrate 21, the sensor structure 22, and the protective film 23. The second flexible substrate 21 is an insulating base material, and is made of film-like resin.

The sensor structure 22 includes a TFT layer 221, a cathode electrode 222, the photodiode PD, and an anode electrode 226.

The TFT layer 221 is provided with thin-film transistors (TFTs), such as the first switching elements Tr, and various types of wiring, such as the gate lines GCL and the signal lines SGL. The second flexible substrate 21 and the TFT layer 221 are a drive circuit board that drives the sensor for each predetermined unit detection area PAA, and are also called a backplane.

The photodiode PD includes an active layer 224, a hole transport layer 223 (first carrier transport layer) provided between the active layer 224 and the cathode electrode 222, and an electron transport layer 225 (second carrier transport layer) provided between the active layer 224 and the anode electrode 226. In other words, the hole transport layer 223, the active layer 224, and the electron transport layer 225 of the photodiode PD are stacked in this order in a direction orthogonal to the second flexible substrate 21.

The active layer 224 changes in characteristics (for example, voltage-current characteristics and resistance value) according to light emitted thereto. An organic material is used as a material of the active layer 224. Specifically, the active layer 224 has a bulk heterostructure containing a mixture of a p-type organic semiconductor and an n-type fullerene derivative ((6,6)-phenyl-$C_{61}$-butyric acid methyl ester (PCBM)) that is an n-type organic semiconductor. As the active layer 224, low-molecular-weight organic materials can be used including, for example, fullerene ($C_{60}$), phenyl-$C_{61}$-butyric acid methyl ester (PCBM), copper phthalocyanine (CuPc), fluorinated copper phthalocyanine ($F_{16}$CuPc), 5, 6, 11, 12-tetraphenyltetracene (rubrene), and perylene diimide (PDI) (derivative of perylene).

The active layer 224 can be formed by a vapor deposition process (dry process) using any of the low-molecular-weight organic materials listed above. In this case, the active layer 224 may be, for example, a multilayered film of CuPc and $F_{16}$CuPc, or a multilayered film of rubrene and $C_{60}$. The active layer 224 can also be formed by a coating process (wet process). In this case, the active layer 224 is made using a material obtained by combining any of the above-listed low-molecular-weight organic materials with a high-molecular-weight organic material. As the high-molecular-weight organic material, for example, poly (3-hexylthiophene) (P3HT) and F8-alt-benzothiadiazole (F8BT) can be used. The active layer 224 can be a film made of a mixture of P3HT and PCBM, or a film made of a mixture of F8BT and PDI.

The hole transport layer 223 and the electron transport layer 225 are provided to facilitate holes and electrons generated in the active layer 224 to reach the cathode electrode 222 or the anode electrode 226. The hole transport layer 223 is in direct contact with the top of the cathode electrode 222. The active layer 224 is in direct contact with the top of the hole transport layer 223. The hole transport layer 223 is a metal oxide layer. For example, tungsten oxide ($WO_3$) or molybdenum oxide is used as the metal oxide layer.

The electron transport layer 225 is in direct contact with the top of the active layer 224, and the anode electrode 226 is in direct contact with the top of the electron transport layer 225. Polyethylenimine ethoxylated (PEIE) is used as a material for the electron transport layer 225.

The materials and the manufacturing methods of the hole transport layer 223, the active layer 224, and the electron transport layer 225 are merely exemplary, and other materials and manufacturing methods may be used.

The cathode electrode 222 faces the anode electrode 226 with the photodiode PD interposed therebetween. For example, a light-transmitting conductive material such as indium tin oxide (ITO) is used as the anode electrode 226. For example, a metal material such as silver (Ag) or aluminum (Al) is used as the cathode electrode 222. Alternatively, the cathode electrode 222 may be made of an alloy material containing at least one or more of these metal materials.

By controlling the film thickness of the cathode electrode 222, the cathode electrode 222 can be formed as a light-transmitting transflective electrode. For example, the cathode electrode 222 is formed of a thin Ag film having a thickness of 10 nm so as to have light transmittance of approximately 60%. In this case, the photodiode PD can detect first light LD incident from a first surface FD side of the optical sensor 1, for example.

The protective film 23 is provided so as to cover the anode electrode 226. The protective film 23 is a passivation film and is provided to protect the photodiode PD. A second surface FU (refer to FIG. 12) of the optical sensor 1 faces the second surface 70A of the first flexible substrate 70 illustrated in FIG. 5.

The detection device 100 turns on the light source 60 at the time of detection while being worn on the object to be detected Fg. Examples of the time of detection include, but are not limited to, a preset date/time or time, and a time when an instruction to start detection is given. The light emitted by the lit-up light source 60 is received by the optical sensor 1 via the object to be detected Fg.

As described above, the detection device 100 includes the annular housing 200, the first flexible substrate 70, the battery 128, the light source 60, and the optical sensor 1. The first flexible substrate 70 is provided along the shape of the annular housing 200. The battery 128 is provided on the first surface 70B of the first flexible substrate 70, and the light source 60 is provided on the second surface 70A of the first flexible substrate 70. The one end 1EA of the second flexible substrate 21 of the optical sensor 1 overlaps the one end 70EA of the first flexible substrate 70, and the second flexible substrate 21 is electrically coupled to the first flexible substrate 70. With this configuration, the optical sensor 1 overlaps the first flexible substrate 70 at only the one end 70EA, thus making the area of overlapping between the optical sensor 1 and the first flexible substrate 70 smaller. The optical sensor 1 protrudes from the first flexible substrate 70. As a result, even when the first flexible substrate 70 circles around the annular housing 200 and overlaps the optical sensor 1, the thickness can be made smaller.

As illustrated in FIG. 2, the first flexible substrate 70 circles around the annular housing 200; the other end 70EB of the first flexible substrate 70 overlaps the second flexible substrate 21; and the battery 128 overlaps the optical sensor 1 as viewed from outside toward inside the housing 200. A space to secure a sufficient capacity of the battery 128 can be ensured even when the battery 128 overlaps the optical sensor 1.

As illustrated in FIG. 2, in an area where the first flexible substrate 70 that circles around the annular housing 200 overlaps the second flexible substrate 21 of the optical sensor 1, the optical sensor 1 is disposed further inside the annular housing 200 than the first flexible substrate 70. Since the second surface 70A of the first flexible substrate 70 faces the inside of the annular housing 200, the light is emitted from the light source 60 at a location different from the location where the optical sensor 1 is disposed, and light transmitted or reflected by the object to be detected Fg can be received.

Figure 13:
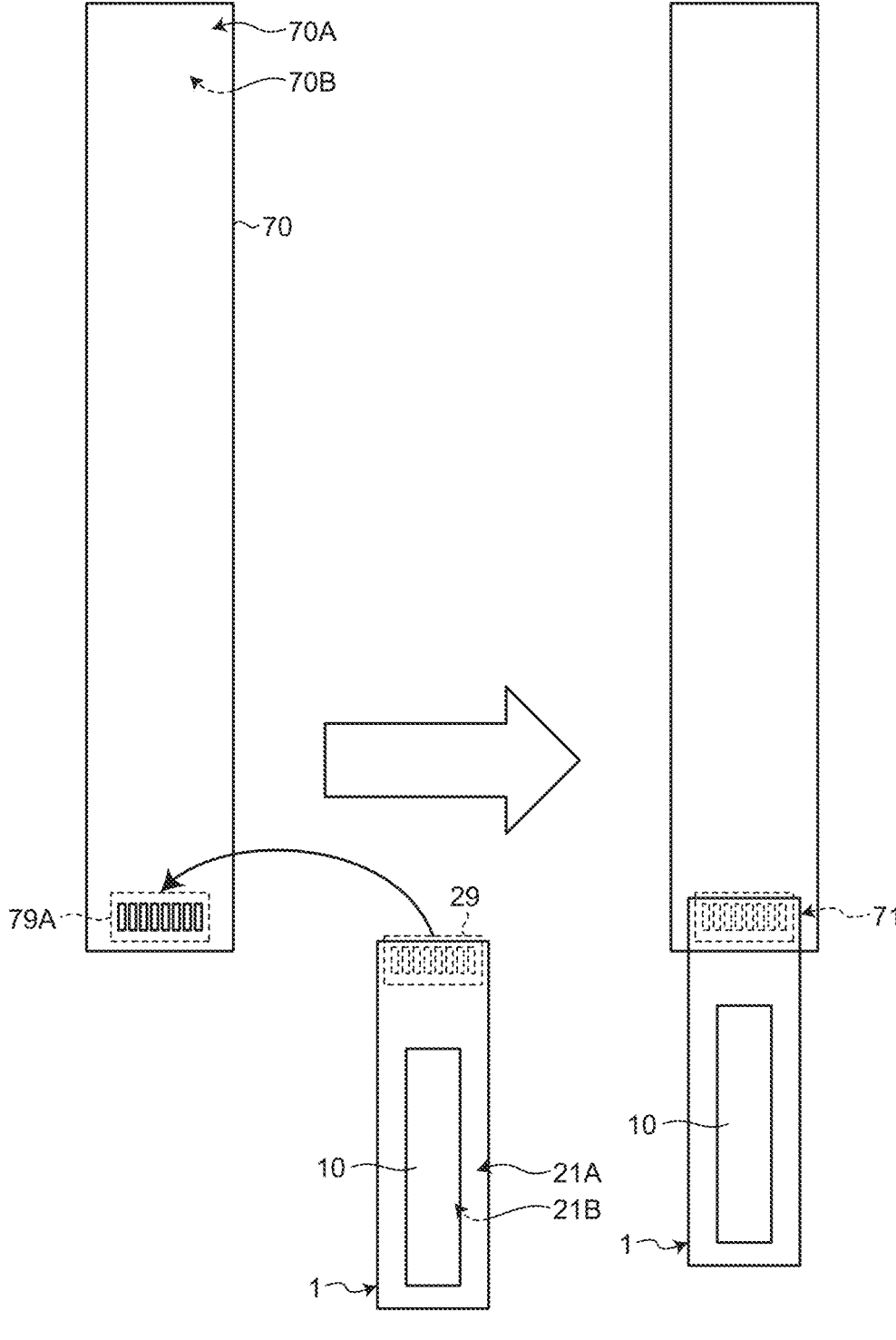
FIG. 13 is an explanatory diagram explaining a procedure for attaching the optical sensor to a first flexible substrate of the first embodiment.

FIG. 13 is an explanatory diagram explaining a procedure for attaching the optical sensor to the first flexible substrate of the first embodiment. In the first embodiment, the second coupling terminal 29 illustrated in FIG. 13 is exposed on a first surface 21B. In this way, the second flexible substrate 21 of the optical sensor 1 includes the second coupling terminal 29 on the first surface 21B of the second flexible substrate 21. The first surface 21B of the second flexible substrate 21 faces the second surface 70A of the first flexible substrate 70. The second coupling terminal 29 of the second flexible substrate 21 is placed on a first coupling terminal 79A exposed on the second surface 70A of the first flexible substrate 70 so as to be opposed to the first coupling terminal 79A. The ACF 71 (FIG. 5) is interposed between the first coupling terminal 79A of the first flexible substrate 70 and the second coupling terminal 29, and electrically couples the first coupling terminal 79A to the second coupling terminal 29. This configuration facilitates electrical coupling between the optical sensor 1 and the first flexible substrate 70.

Second Embodiment

Figure 14:
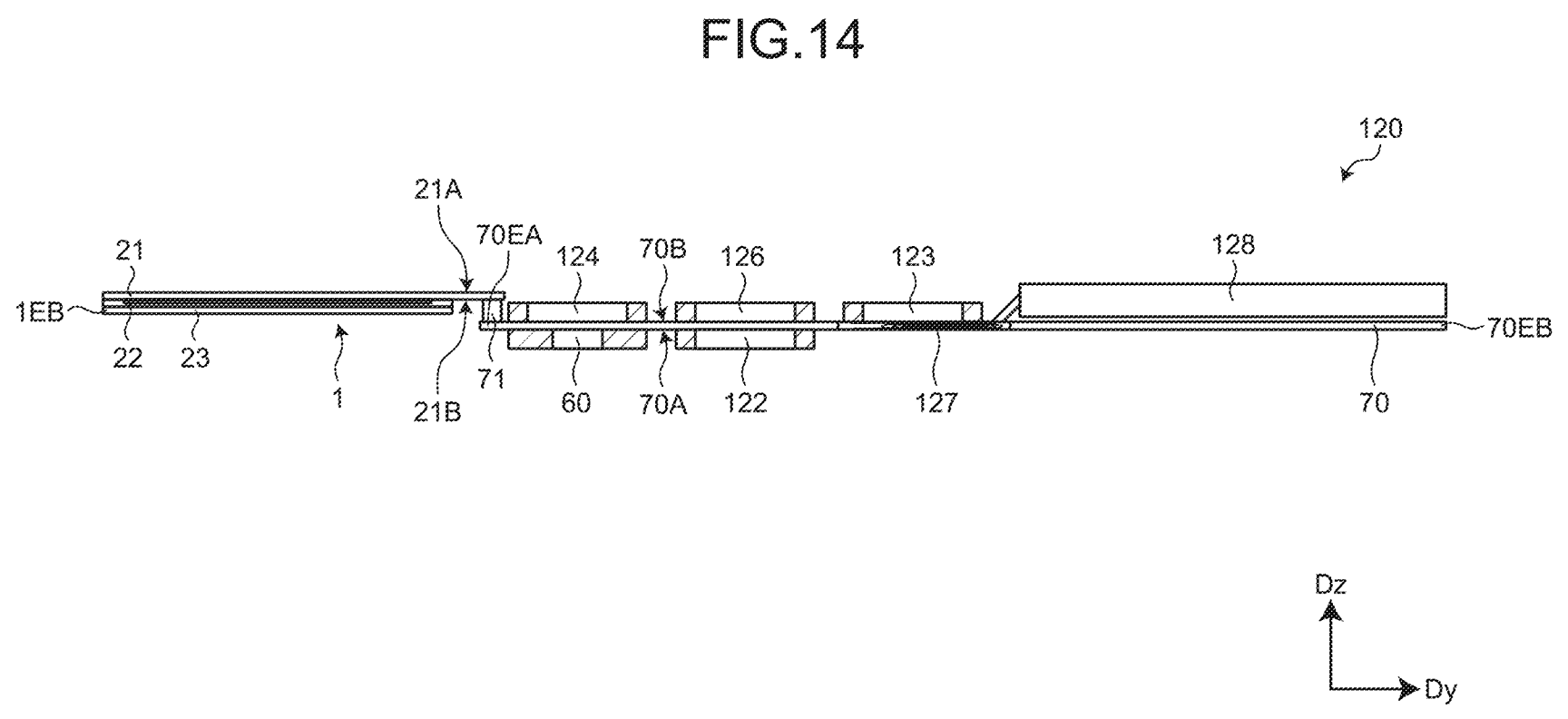
Figure 15:
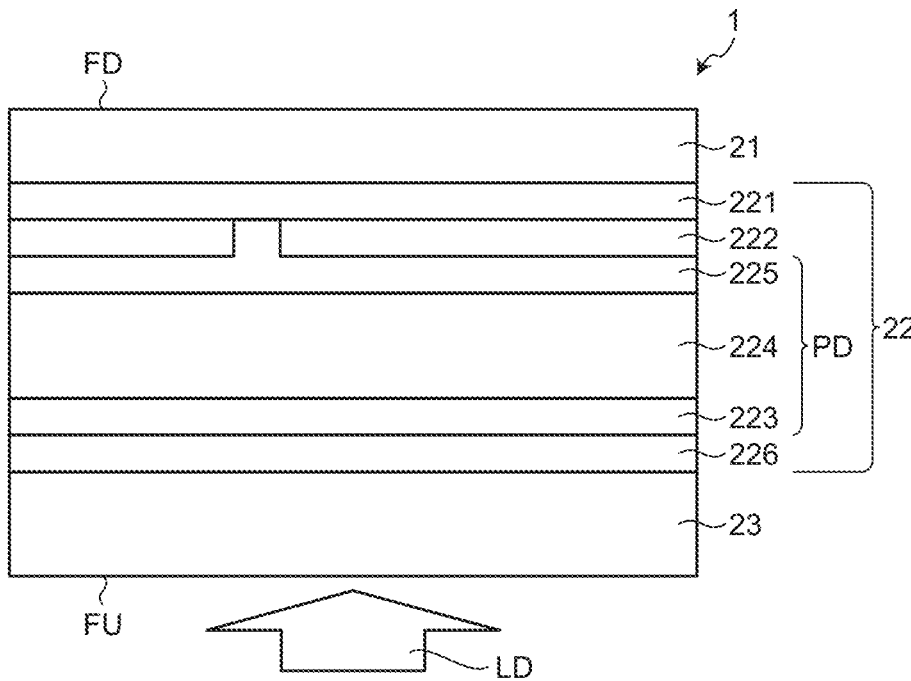
FIG. 15 is a schematic sectional view of the optical sensor of the second embodiment.

FIG. 14 is a sectional view of the optical sensor module according to a second embodiment before being accommodated in the housing. FIG. 15 is a schematic sectional view of the optical sensor of the second embodiment. In the second embodiment, the same components as those described in the first embodiment are denoted by the same reference numerals, and will not be described in detail.

In the optical sensor module 120 of the second embodiment, the optical sensor 1 is mounted in the opposite orientation, unlike in the first embodiment. Therefore, as illustrated in FIG. 14, the first surface 21B of the second flexible substrate 21 faces the first surface 70B of the first flexible substrate 70. The second flexible substrate 21 includes the second coupling terminal 29 (refer to FIG. 8) on the first surface 21B of the second flexible substrate 21. The second coupling terminal 29 is placed on a first coupling terminal exposed on the first surface 70B of the first flexible substrate 70 so as to be opposed to the first coupling terminal. The ACF 71 is interposed between the first coupling terminal of the first flexible substrate 70 and the second coupling terminal 29, and electrically couples the first coupling terminal to the second coupling terminal 29. This configuration facilitates the electrical coupling between the optical sensor 1 and the first flexible substrate 70.

As illustrated in FIG. 15, the photodiode PD can detect the first light LD emitted, for example, from the second surface FU side of the optical sensor 1. This configuration allows the thickness of the cathode electrode 222 to be increased to be opaque, thus being capable of reducing the electrical resistance of the cathode electrode 222.

The electrical coupling between the optical sensor 1 and the first flexible substrate 70 is made by placing a low-melting-point metal 71A, such as solder, so as to cover an end face of the second flexible substrate 21 of the optical sensor 1.

Third Embodiment

Figure 16:
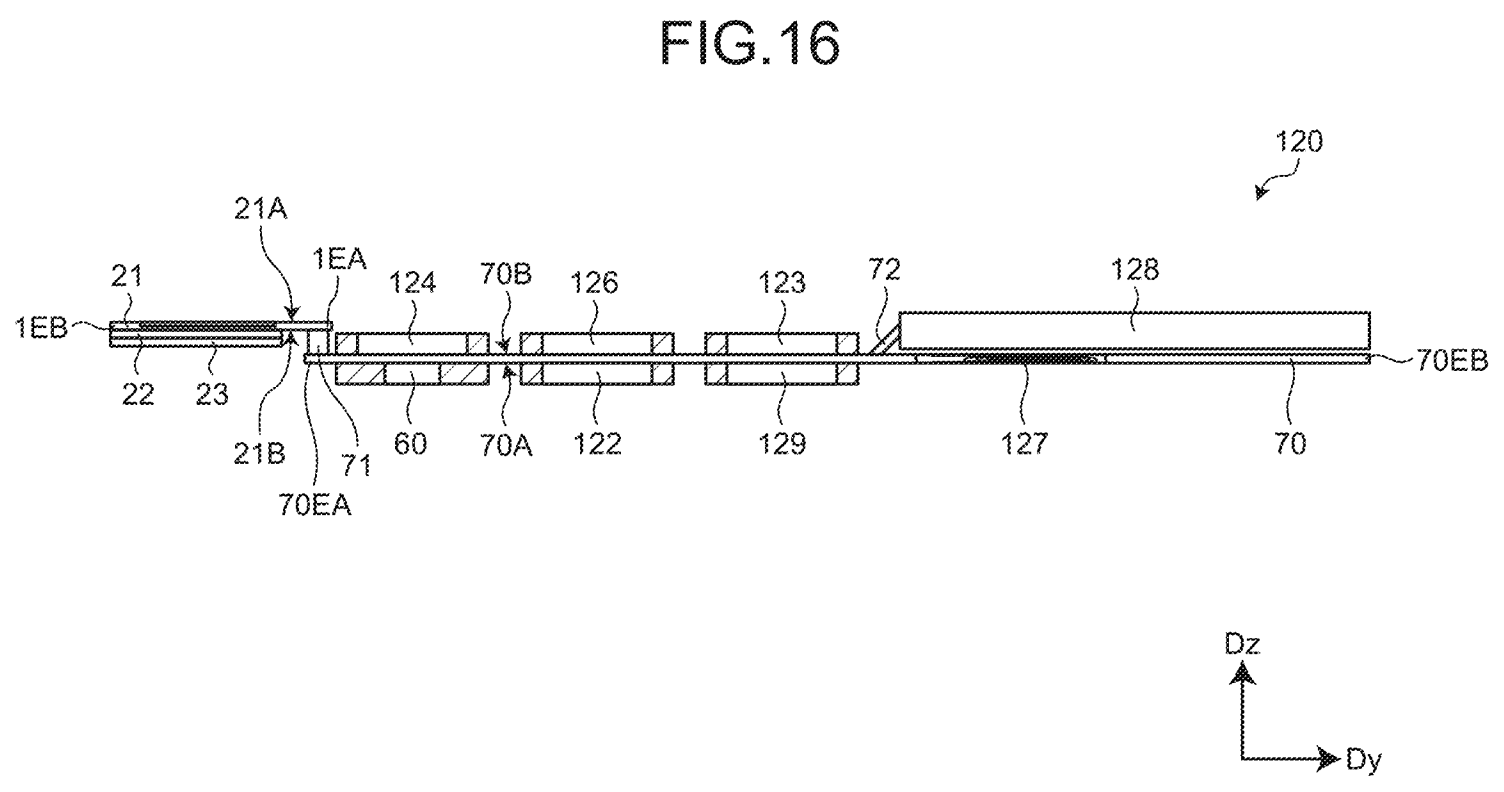
Figure 17:
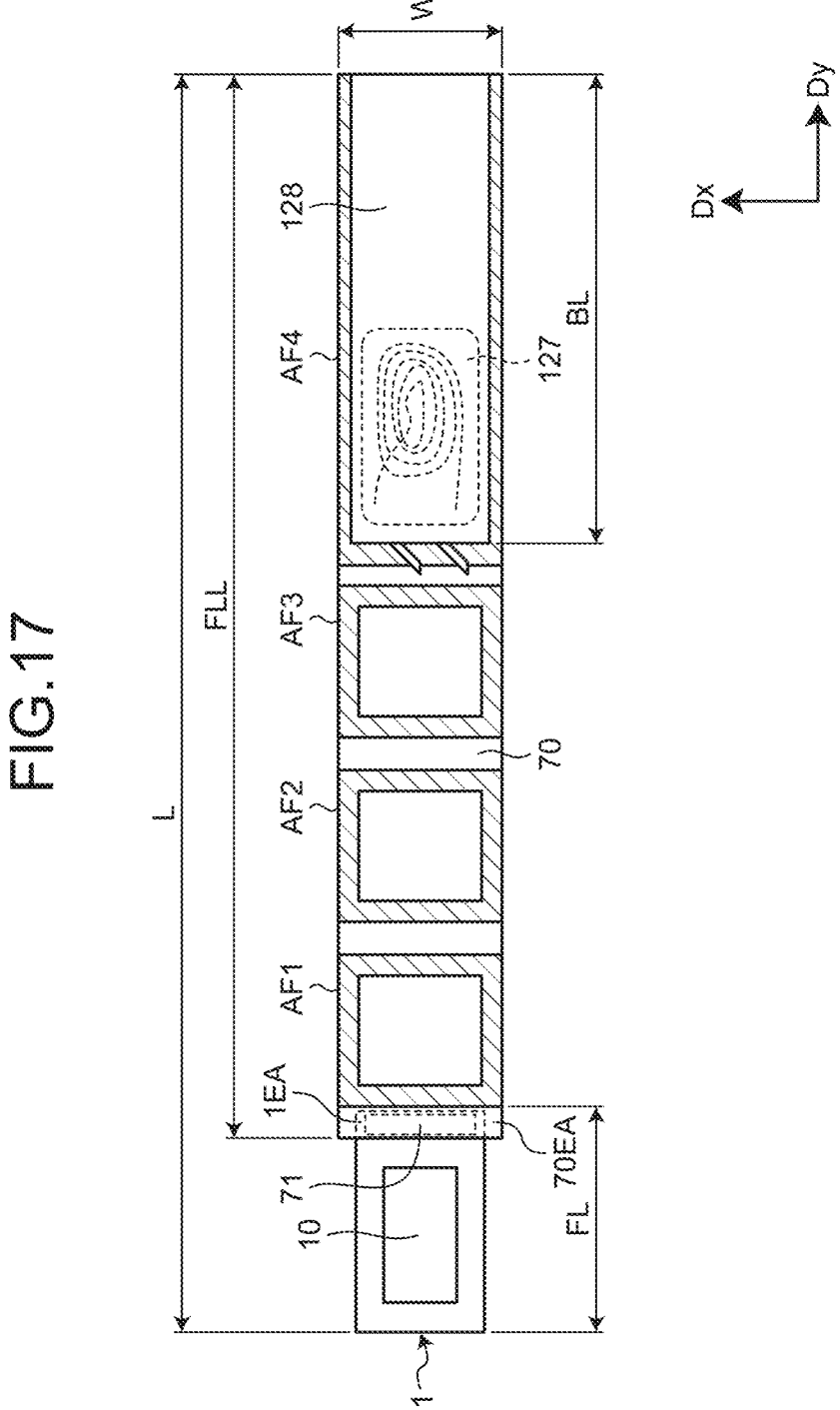
FIG. 17 is a top view of the optical sensor module of FIG. 16.
Figure 18:
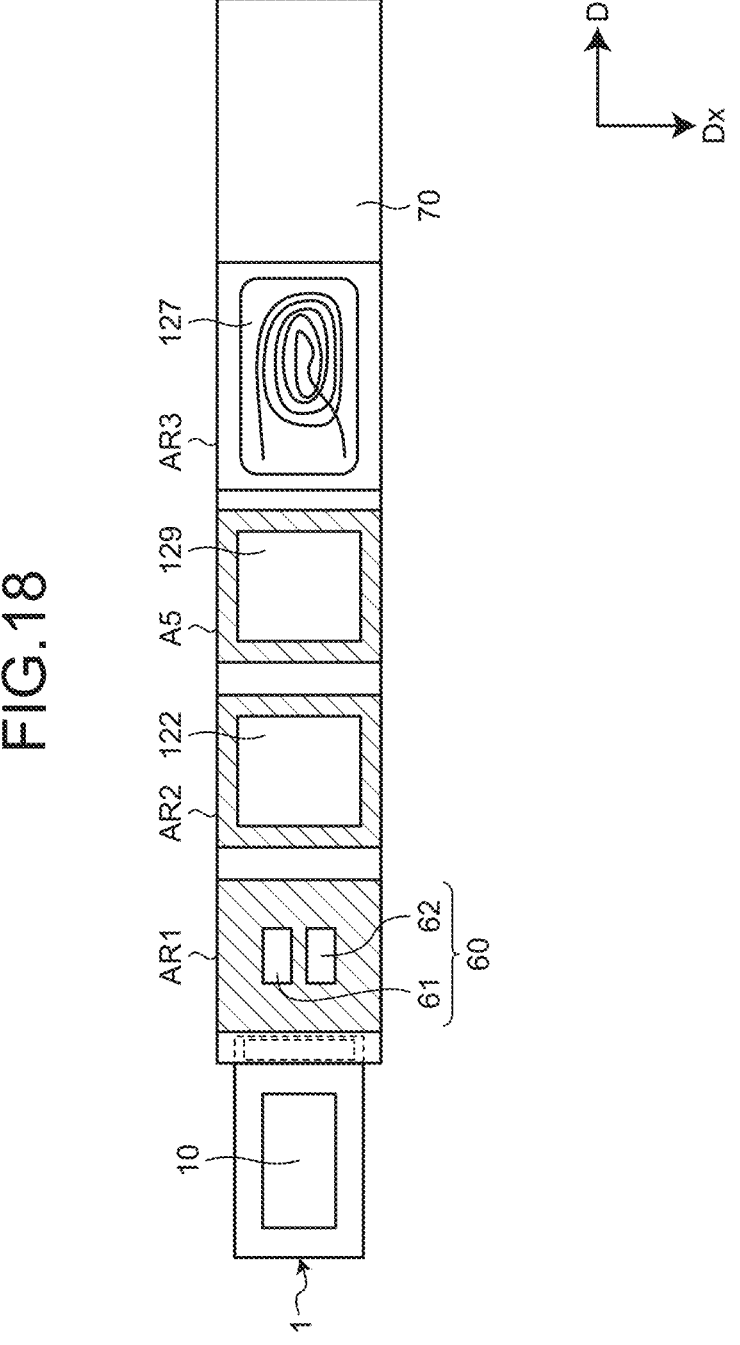
FIG. 18 is a bottom view of the optical sensor module of FIG. 16.

FIG. 16 is a sectional view of the optical sensor module according to a third embodiment before being accommodated in the housing. FIG. 17 is a top view of the optical sensor module of FIG. 16. FIG. 18 is a bottom view of the optical sensor module of FIG. 16. In the third embodiment, the same components as those described in the first embodiment or the second embodiment are denoted by the same reference numerals, and will not be described in detail.

As illustrated in FIGS. 16, 17, and 18, the battery charging coil 127 is disposed in a position overlapping the battery 128 in plan view.

The length FL in the second direction Dy of the second flexible substrate 21 of the optical sensor 1 is smaller than the length BL in the second direction Dy of the battery 128. As illustrated in FIG. 2, in the area where the first flexible substrate 70 that circles around the annular housing 200 overlaps the second flexible substrate 21, the optical sensor 1 is disposed further inside the annular housing 200 than the first flexible substrate 70. On the first flexible substrate 70, the battery 128 overlaps the optical sensor 1. The area of the battery 128 in plan view is larger than that of the optical sensor 1. Therefore, the outline of the battery 128 surrounds the outline of the optical sensor 1. Therefore, even when the first flexible substrate 70 is curved along the shape of the housing, a stress applied to the optical sensor 1 is difficult to be locally concentrated. As a result, the quality of the optical sensor 1 is improved. In this case, the battery charging coil 127 does not overlap the optical sensor 1.

Fourth Embodiment

Figure 19:
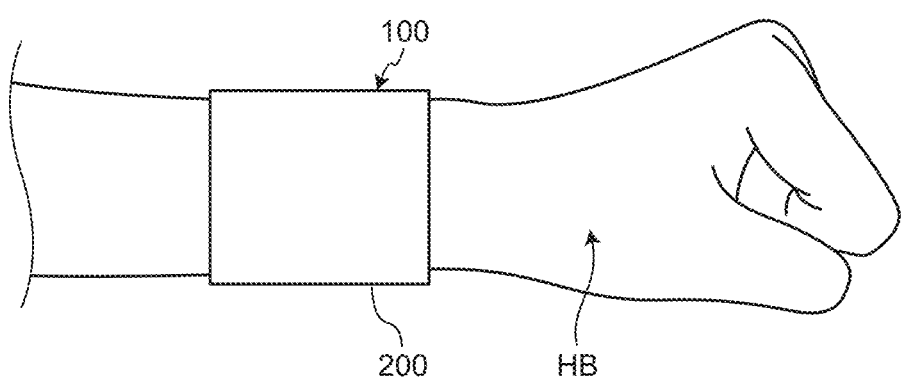
FIG. 19 is a schematic view illustrating an exemplary external appearance when a state of an arm accommodated inside the detection device according to a fourth embodiment is viewed from the lateral side of the housing.

FIG. 19 is a schematic view illustrating an exemplary external appearance when a state of an arm accommodated inside the detection device according to a fourth embodiment is viewed from the lateral side of the housing. In the fourth embodiment, the same components as those described in the first embodiment, the second embodiment, or the third embodiment are denoted by the same reference numerals, and will not be described in detail.

The detection device 100 illustrated in FIG. 19 is a ring-shaped device that can be worn on and removed from the human body and is worn on the object to be detected Fg of the human body. The object to be detected Fg in the fourth embodiment is a wrist. The detection device 100 can detect the biometric information on the living body from the object to be detected Fg wearing the detection device 100.

The components in the embodiments described above can be combined as appropriate. Other operational advantages accruing from the aspects described in the embodiments of the present disclosure that are obvious from the description herein, or that are conceivable as appropriate by those skilled in the art will naturally be understood as accruing from the present disclosure.

What is claimed is:

1. A detection device comprising:
an annular housing;
a first flexible substrate provided along a shape of the annular housing;
a battery provided on the first flexible substrate;
a light source provided on the first flexible substrate; and
an optical sensor comprising a second flexible substrate and a plurality of photodiodes provided in a detection area of the second flexible substrate, wherein
one end of the second flexible substrate of the optical sensor overlaps one end of the first flexible substrate, and the second flexible substrate is electrically coupled to the first flexible substrate.

2. The detection device according to claim 1, wherein the first flexible substrate circles around the annular housing, the other end of the first flexible substrate overlaps the second flexible substrate, and the battery overlaps the optical sensor as viewed from outside toward inside the annular housing.

3. The detection device according to claim 2, wherein
the first flexible substrate comprises a first coupling terminal on a second surface of the first flexible substrate,
the second flexible substrate has a first surface and a second surface,
the first surface of the second flexible substrate is a surface on which the photodiodes are formed, and the second surface of the second flexible substrate is a surface opposite the first surface of the second flexible substrate,
the second flexible substrate comprises a second coupling terminal on the first surface of the second flexible substrate,
the first surface of the second flexible substrate faces the second surface of the first flexible substrate, and
the second coupling terminal is electrically coupled to the first coupling terminal.

4. The detection device according to claim 2, wherein
the first flexible substrate comprises a first coupling terminal on a first surface of the first flexible substrate,
the second flexible substrate has a first surface and a second surface,
the first surface of the second flexible substrate is a surface on which the photodiodes are formed, and the second surface of the second flexible substrate is a surface opposite the first surface of the second flexible substrate,
the second flexible substrate comprises a second coupling terminal on the first surface of the second flexible substrate,
the first surface of the second flexible substrate faces the first surface of the first flexible substrate, and
the second coupling terminal is electrically coupled to the first coupling terminal.

5. The detection device according to claim 2, wherein in an area where the first flexible substrate that circles around the annular housing overlaps the second flexible substrate, the optical sensor is disposed further inside the annular housing than the first flexible substrate.

6. The detection device according to claim 1, wherein
the battery is provided on a first surface of the first flexible substrate,
the light source is provided in a first area of a second surface of the first flexible substrate opposite the first surface, and
the second surface of the first flexible substrate faces an inside of the annular housing.

7. The detection device according to claim 6, further comprising, on a first surface of the first flexible substrate, a control circuit to control light emission of the light source, wherein
the control circuit is disposed opposite the first area.

8. The detection device according to claim 6, wherein
the first flexible substrate further comprises a coil to charge the battery, and
the coil is disposed in a position that is different from those of the light source and the battery and is between the light source and the battery.

9. The detection device according to claim 1, wherein
the battery is provided on a first surface of the first flexible substrate,
the detection device further comprises a coil to charge the battery,
the coil is provided in a first area of a second surface of the first flexible substrate opposite the first surface, and
the coil is disposed opposite the battery and overlaps the battery as viewed from outside toward inside the housing.

10. The detection device according to claim 1, wherein the first flexible substrate further comprises a coil to charge the battery.

11. The detection device according to claim 1, wherein the second flexible substrate has a smaller width than the first flexible substrate.

* * * * *